(12) United States Patent
Han et al.

(10) Patent No.: US 9,748,077 B2
(45) Date of Patent: Aug. 29, 2017

(54) SUBSTRATE PROCESSING DEVICE AND SUBSTRATE PROCESSING METHOD

(71) Applicant: JUSUNG ENGINEERING CO., LTD., Gwangju-si, Gyeonggi-do (KR)

(72) Inventors: Jeung Hoon Han, Gwangju-si (KR); Chul Joo Hwang, Seongnam-si (KR); Seung Hoon Seo, Gwangju-si (KR); Sang Don Lee, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 14/404,448

(22) PCT Filed: May 28, 2013

(86) PCT No.: PCT/KR2013/004679
§ 371 (c)(1),
(2) Date: Nov. 26, 2014

(87) PCT Pub. No.: WO2013/180453
PCT Pub. Date: Dec. 5, 2013

(65) Prior Publication Data
US 2015/0235812 A1  Aug. 20, 2015

(30) Foreign Application Priority Data

May 29, 2012 (KR) .......................... 10-2012-0057041
May 30, 2012 (KR) .......................... 10-2012-0057045

(51) Int. Cl.
*H01J 37/32* (2006.01)
*C23C 16/455* (2006.01)
(Continued)

(52) U.S. Cl.
CPC ...... *H01J 37/32532* (2013.01); *C23C 16/455* (2013.01); *C23C 16/458* (2013.01); *C23C 16/50* (2013.01)

(58) Field of Classification Search
None
See application file for complete search history.

(56) References Cited

U.S. PATENT DOCUMENTS

2001/0006093 A1* 7/2001 Tabuchi .................. C23C 16/24
156/345.43
2004/0248391 A1* 12/2004 Elyaakoubi ....... H01L 21/67069
438/578

(Continued)

FOREIGN PATENT DOCUMENTS

CN  101387835 A  3/2009
CN  101809711 A  8/2010

(Continued)

*Primary Examiner* — Joseph Miller, Jr.

(57) ABSTRACT

Disclosed is an apparatus and method of processing substrate, wherein the apparatus comprises a process chamber; a substrate supporter for supporting at least one of substrates, wherein the substrate supporter is provided in the process chamber, and is rotated at a predetermined direction; a chamber lid confronting with the substrate supporter, the chamber lid for covering the process chamber; and a gas distributor having a plurality of gas distribution modules for distributing gas to the substrate, wherein the plurality of gas distribution modules are connected to the chamber lid, wherein each of the gas distribution modules includes a power source electrode and a ground electrode confronting each other, a plasma discharge space is formed between the power source electrode and the ground electrode, and the plasma discharge space is not overlapped with a thin film formation region of the substrate supported by the substrate supporter.

6 Claims, 9 Drawing Sheets

(51) Int. Cl.
 *C23C 16/458* (2006.01)
 *C23C 16/50* (2006.01)

(56) References Cited

U.S. PATENT DOCUMENTS

| | | | |
|---|---|---|---|
| 2009/0071940 A1 | 3/2009 | Miyagi et al. | |
| 2009/0159432 A1* | 6/2009 | Kawano | C23C 16/45563 |
| | | | 204/192.15 |
| 2010/0068413 A1 | 3/2010 | Lee | |
| 2010/0190341 A1 | 7/2010 | Park et al. | |
| 2012/0114877 A1 | 5/2012 | Lee | |
| 2012/0228129 A1* | 9/2012 | Ito | C23C 16/24 |
| | | | 204/298.02 |
| 2012/0247390 A1 | 10/2012 | Sawada et al. | |

FOREIGN PATENT DOCUMENTS

| | | |
|---|---|---|
| KR | 20090008799 A | 1/2009 |
| KR | 20090028414 A | 3/2009 |
| KR | 20090078978 A | 7/2009 |
| KR | 20100013148 A | 2/2010 |
| KR | 101039524 B1 | 6/2011 |
| WO | 2011033927 A1 | 3/2011 |

* cited by examiner

SUBSTRATE PROCESSING DEVICE AND SUBSTRATE PROCESSING METHOD

FIELD OF THE INVENTION

The present invention relates to a substrate processing apparatus, and more particularly, to an apparatus and method of processing substrate which facilitate to improve a deposition uniformity of a thin film deposited on a substrate.

DISCUSSION OF THE RELATED ART

Generally, in order to manufacture a solar cell, a semiconductor device and a flat panel display device, it is necessary to form a predetermined thin film layer, a thin film circuit pattern or an optical pattern on a surface of a substrate. Thus, a semiconductor manufacturing process may be carried out, for example, a thin film deposition process of depositing a thin film of a predetermined material on a substrate, a photo process of selectively exposing the thin film by the use of photosensitive material, and an etching process of forming a pattern by selectively removing an exposed portion of the thin film.

The semiconductor manufacturing process is performed inside a substrate processing apparatus designed to be suitable for optimal circumstances. Recently, a substrate processing apparatus using plasma is generally used to carry out a deposition or etching process.

This semiconductor manufacturing process using plasma may be a PECVD (Plasma Enhanced Chemical Vapor Deposition) apparatus for forming a thin film, or a plasma etching apparatus for etching and patterning the thin film.

FIG. 1 illustrates a substrate processing apparatus according to the related art.

Referring to FIG. 1, the substrate processing apparatus according to the related art may include a chamber 10, a power source electrode 20, a susceptor 30, and a gas distributing means 40.

The chamber 10 provides a reaction space for substrate processing. In this case, a predetermined portion of a bottom surface of the chamber 10 is communicated with an exhaust pipe 12 for discharging gas from the reaction space.

The power source electrode 20 is provided over the chamber 10 so as to seal the reaction space.

One side of the power source electrode 20 is electrically connected with a RF (Radio Frequency) power source 24 through a matching member 22. The RF power source 24 generates RF power, and supplies the generated RF power to the power source electrode 20.

Also, a central portion of the power source electrode 20 is communicated with a gas supply pipe 26 supplying source gas for the substrate processing.

The matching member 22 is connected between the power source electrode 20 and the RF power source 24, to thereby match load impedance and source impedance of the RF power supplied from the RF power source 24 to the power source electrode 20.

The susceptor 30 is provided inside the chamber 10, and the susceptor 30 supports a plurality of substrates W loaded from the external. The susceptor 30 corresponds to an opposite electrode in opposite to the power source electrode 20, and the susceptor 30 is electrically grounded by an elevating axis 32 for elevating the susceptor 30.

The elevating axis 32 is moved up and down by an elevating apparatus (not shown). In this case, the elevating axis 32 is surrounded by a bellows 34 for sealing the elevating axis 32 and the bottom surface of the chamber 10.

The gas distributing means 40 is provided below the power source electrode 20, wherein the gas distributing means 40 confronts with the susceptor 30. In this case, a gas diffusion space 42 is formed between the gas distributing means 40 and the power source electrode 20. Inside the gas diffusion space 42, the source gas supplied from the gas supply pipe 26 penetrating through the power source electrode 20 is diffused. The gas distributing means 40 uniformly distributes the source gas to the entire area of the reaction space through a plurality of gas distributing holes 44 being communicated with the gas diffusion space 42.

In case of the substrate processing apparatus according to the related art, after the substrate (W) is loaded onto the susceptor 30, the predetermined source gas is distributed to the reaction space of the chamber 10, and the RF power is supplied to the power source electrode 20 so as to form the plasma in the reaction space, whereby a predetermined thin film is formed on the substrate (W).

However, in case of the substrate processing apparatus according to the related art, the space for distributing the source gas is the same as the space for forming the plasma. Thus, the plasma discharge is performed on the substrate (W), whereby the substrate (W) may be damaged by the plasma discharge, thereby deteriorating quality of the thin film on the substrate (W).

DETAILED DESCRIPTION OF THE INVENTION

Task to be Solved

An aspect of the present invention is to provide an apparatus and method of processing substrate, which facilitate to prevent a plasma discharge from being transferred to a substrate, thereby preventing the substrate from being damaged by the plasma discharge, and preventing quality of a thin film deposited on the substrate from being deteriorated.

Technical Solution

To achieve these and other advantages and in accordance with the purpose of the invention, there is provided a substrate processing apparatus comprising: a process chamber; a substrate supporter for supporting at least one of substrates, wherein the substrate supporter is provided in the process chamber, and the substrate supporter is rotated at a predetermined direction; a chamber lid confronting with the substrate supporter, the chamber lid for covering an upper side of the process chamber; and a gas distributor having a plurality of gas distribution modules for distributing gas to the substrate, wherein the plurality of gas distribution modules are connected to the chamber lid, wherein each of the gas distribution modules includes a power source electrode and a ground electrode confronting each other, a plasma discharge space is formed between the power source electrode and the ground electrode, and the plasma discharge space is not overlapped with a thin film formation region of the substrate supported by the substrate supporter.

In another aspect of the present invention, there is a substrate processing apparatus comprising: a process chamber; a substrate supporter for supporting at least one of substrates, wherein the substrate supporter is provided in the process chamber, and the substrate supporter is rotated at a predetermined direction; a chamber lid confronting with the substrate supporter, the chamber lid for covering an upper side of the process chamber; and a gas distributor having a plurality of gas distribution modules for distributing gas to the substrate, wherein the plurality of gas distribution modules are connected to the chamber lid, wherein each of the gas distribution modules includes a power source electrode and a ground electrode confronting each other, a plasma discharge space is formed between the power source electrode and the ground electrode, and wherein the substrate supporter is connected with a predetermined elevating apparatus, the plasma discharge space is not overlapped with a thin film formation region of the substrate supported by the substrate supporter when the substrate supporter is moved down by the use of elevating apparatus, and the plasma discharge space is overlapped with the thin film formation region of the substrate supported by the substrate supporter when the substrate supporter is moved up by the use of elevating apparatus.

In another aspect of the present invention, there is provided a substrate processing method comprising: installing a plurality of gas distribution modules in a process chamber, and loading at least one substrate onto a substrate supporter; rotating the substrate supporter; and distributing a gas from at least one of the plurality of gas distribution modules to the substrate, and generating a plasma discharge, wherein each of the gas distribution modules includes a power source electrode and a ground electrode confronting each other, a plasma discharge space is formed between the power source electrode and the ground electrode, and the plasma discharge space is not overlapped with a thin film formation region of the substrate supported by the substrate supporter.

In another aspect of the present invention, there is provided a substrate processing method comprising: installing a plurality of gas distribution modules in a process chamber, and loading at least one substrate onto a substrate supporter; rotating the substrate supporter; distributing a first gas from at least one of the plurality of gas distribution modules to the substrate, and generating a first plasma discharge; and distributing a second gas from at least one of the plurality of gas distribution modules to the substrate, and generating a second plasma discharge; wherein the first plasma discharge is performed under the condition that a plasma discharge space is overlapped with a thin film formation region of the substrate loaded onto the substrate supporter, and wherein the second plasma discharge is performed under the condition that the plasma discharge space is not overlapped with the thin film formation region of the substrate loaded onto the substrate supporter.

In another aspect of the present invention, there is provided a substrate processing apparatus comprising: a process chamber; a substrate supporter for supporting at least one of substrates, wherein the substrate supporter is provided in the process chamber, the substrate supporter is rotated at a predetermined direction, and a rotation speed of the substrate supporter is changeable; a chamber lid confronting with the substrate supporter, the chamber lid for covering an upper side of the process chamber; and a gas distributor having a plurality of gas distribution modules for distributing gas to the substrate, wherein the plurality of gas distribution modules are connected to the chamber lid, wherein each of the gas distribution modules is provided with a first gas distribution space for distributing a first gas and a second gas distribution space for distributing a second gas, which are spatially separated from each other, and wherein the substrate supporter is connected with a predetermined elevating apparatus, and is moved up and down by the use of elevating apparatus so as to change an interval between the gas distribution module and the substrate supporter.

In a further aspect of the present invention, there is provided a substrate processing method comprising: installing a plurality of gas distribution modules in a process chamber, and loading at least one substrate onto a substrate supporter; determining an interval between the gas distribution module and the substrate supporter, and adjusting the interval by moving the substrate supporter; determining a rotation speed of the substrate supporter, and rotating the substrate supporter according to the rotation speed; and performing a thin film formation process to form a thin film layer by distributing a gas from at least one of the plurality of gas distribution modules to the substrate, wherein each of the gas distribution modules is provided with a first gas distribution space for distributing a first gas and a second gas distribution space for distributing a second gas, which are spatially separated from each other, and the thin film layer is formed by the first gas and the second gas during the thin film formation process.

DETAILED DESCRIPTION OF THE INVENTION

Hereinafter, embodiments of the present invention will be described in detail with reference to the accompanying drawings.

Figure 1:
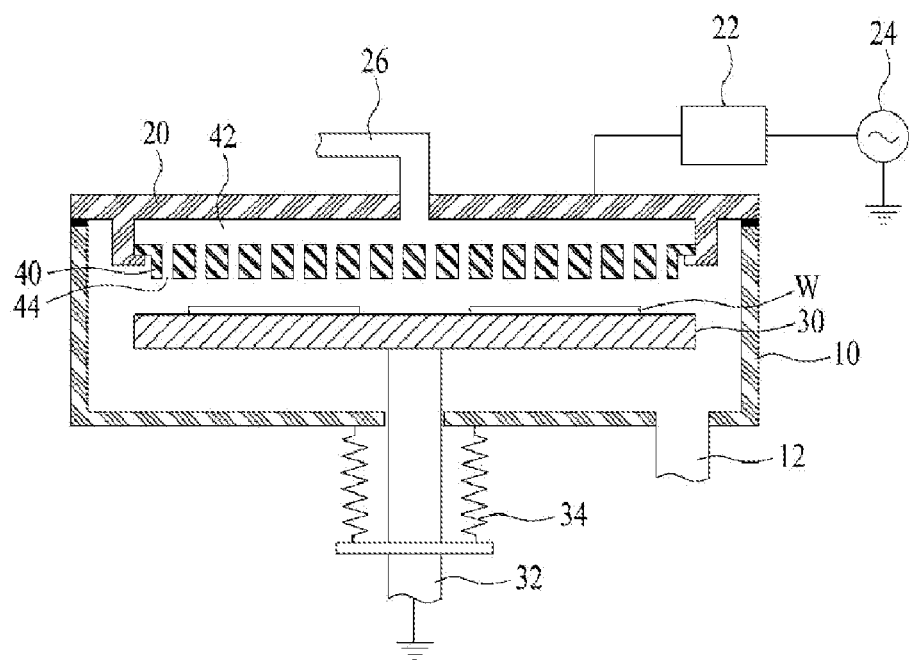
FIG. 1 illustrates a substrate processing apparatus according to the related art.
Figure 2:
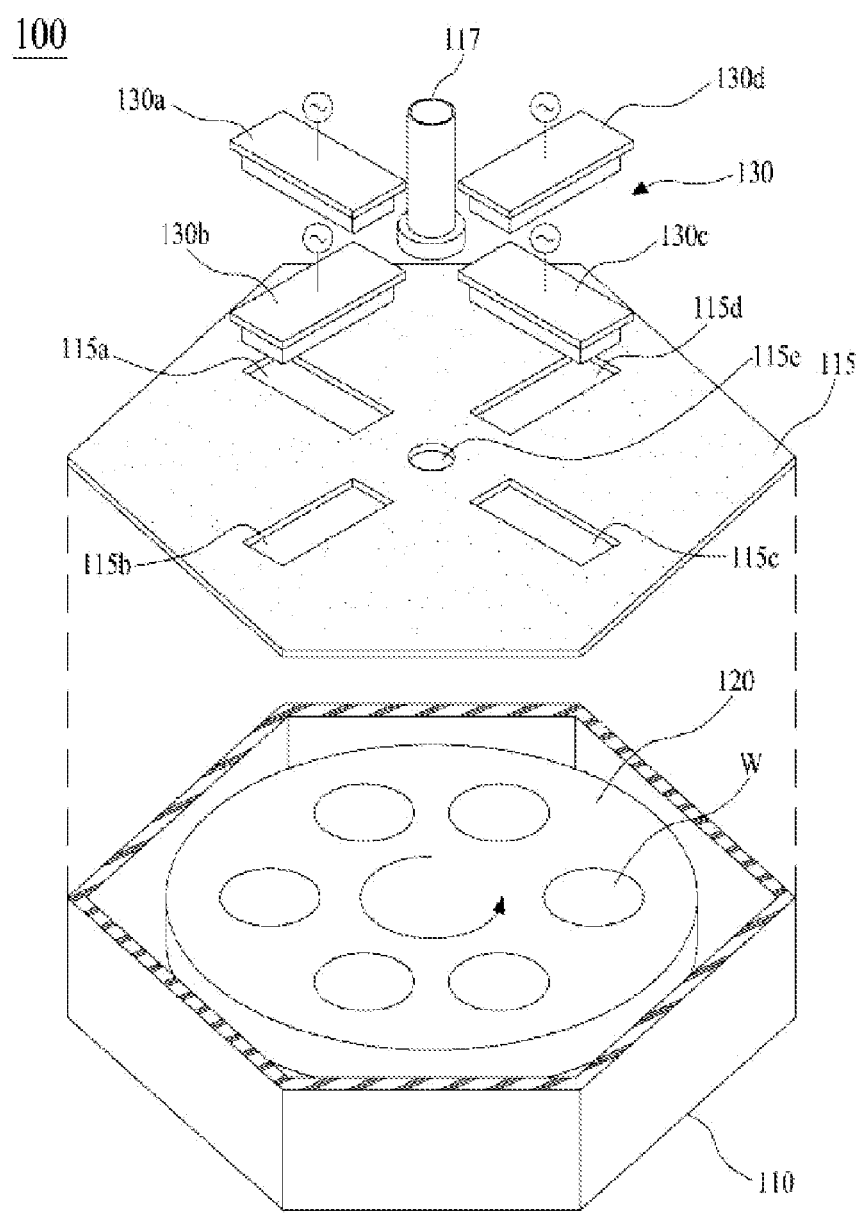
FIG. 2 illustrates a substrate processing apparatus according to one embodiment of the present invention.
Figure 3:
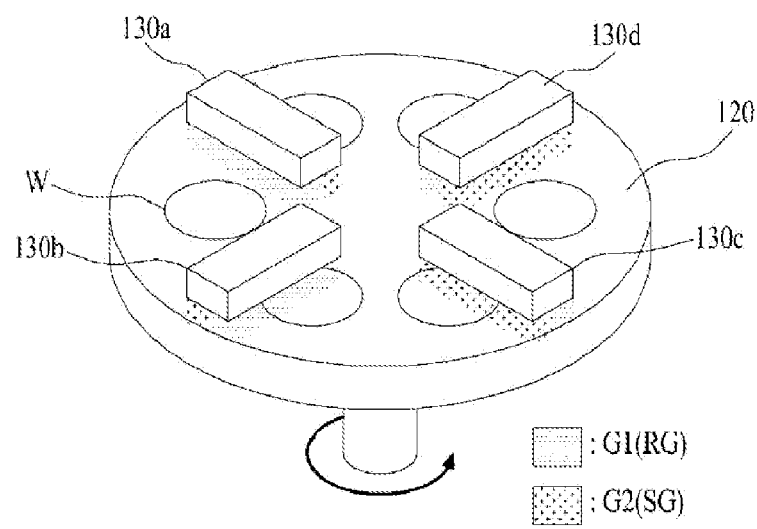
FIG. 3 is a concept view illustrating a plurality of gas distribution modules arranged on a substrate supporter according to one embodiment of the present invention.
Figure 4:
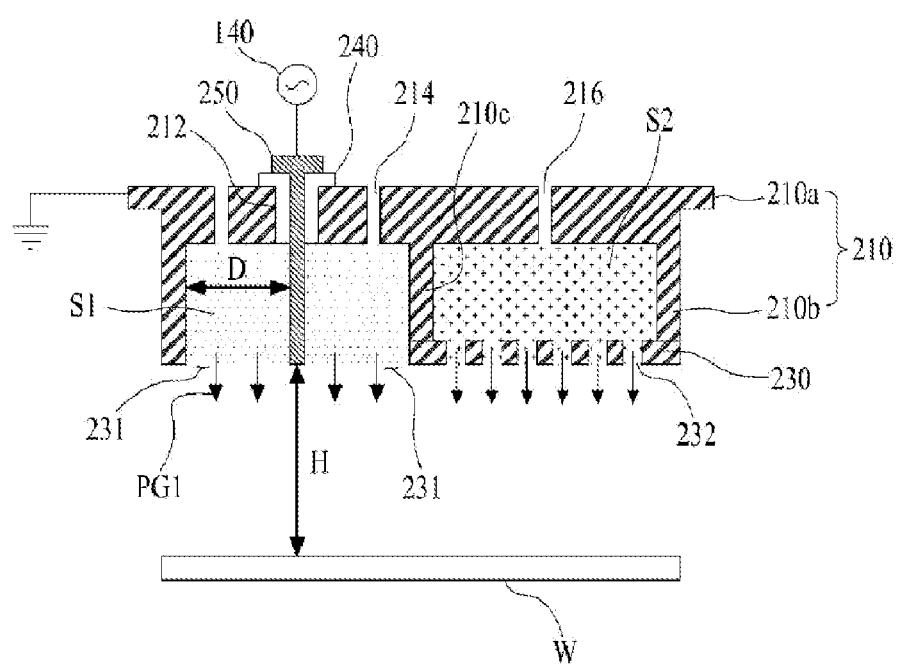
FIG. 4 is a cross sectional view illustrating a gas distribution module arranged on a substrate according to one embodiment of the present invention.

FIG. 2 illustrates a substrate processing apparatus according to one embodiment of the present invention. FIG. 3 is a concept view illustrating a plurality of gas distribution modules arranged on a substrate supporter according to one embodiment of the present invention. FIG. 4 is a cross sectional view illustrating a gas distribution module arranged on a substrate (W) according to one embodiment of the present invention.

Referring to FIGS. 2 to 4, the substrate processing apparatus according to one embodiment of the present invention may include a process chamber 110, a chamber lid 115, a substrate supporter 120, and a gas distributor 130.

The process chamber 110 provides a reaction space for substrate processing, for example, a thin film deposition process. A bottom surface and/or a lateral surface of the process chamber 110 may be communicated with an exhaust pipe (not shown) for discharging gas from the reaction space.

The chamber lid 115 is provided on the process chamber 110, that is, the chamber lid 115 covers the process chamber 110, wherein the chamber lid 115 is electrically grounded. The chamber lid 115 supports the gas distributor 130, wherein the chamber lid 115 includes a plurality of module receivers 115a, 115b, 115c and 115d to divide an upper side of the substrate supporter 120 into a plurality of spaces. The plurality of module receivers 115a, 115b, 115c and 115d may be disposed as a radial pattern in the chamber lid 115, that is, the plurality of module receivers 115a, 115b, 115c and 115d may be provided at every 90° with respect to a central point of the chamber lid 115.

The process chamber 110 and the chamber lid 115 may be formed in a polygonal structure such as a hexagonal structure shown in the drawings, or may be formed in a circular or elliptical structure.

In FIG. 2, the chamber lid 115 includes the four module receivers 115a, 115b, 115c and 115d, but it is not limited to this number. For example, the chamber lid 115 may include 2N ('N' is an integer above 0) module receivers symmetrically provided with respect to the central point of the chamber lid 115, but not necessarily. The chamber lid 115 may include the odd-numbered module receivers. Hereinafter, it is assumed that the chamber lid 115 includes the first to fourth module receivers 115a, 115b, 115c and 115d.

The reaction space of the process chamber 110 sealed by the aforementioned chamber lid 115 may be connected to an external pumping means (not shown) through a pumping pipe 117 provided in the chamber lid 115.

The pumping pipe 117 is communicated with the reaction space of the process chamber 110 through a pumping hole 115e provided in the center of the chamber lid 115. Accordingly, the inside of the process chamber 115 may be a vacuum state or an atmospheric state in accordance with a pumping operation of the pumping means through the use of pumping pipe 117. In this case, an exhaust process of the reaction space may use an upper central exhaust method using the pumping pipe 117 and the pumping hole 115e, but not limited to this method. It is possible to omit the pumping pipe 117 and the pumping hole 115e.

The substrate supporter 120 is rotatably provided inside the process chamber 110, wherein the substrate supporter 120 may be electrically floating or grounded. The substrate supporter 120 is supported by a rotation axis (not shown) penetrating through a central portion of the bottom surface of the process chamber 110. According as the rotation axis is rotated by driving an axis driving member (not shown), the substrate supporter 120 is rotated to a predetermined direction (for example, counterclockwise direction). The rotation axis exposed out of the bottom surface of the process chamber 100 is sealed by a bellows (not shown) provided in the bottom surface of the process chamber 110.

The substrate supporter 120 supports at least one substrate (W) loaded by an external substrate loading apparatus (not shown). The substrate supporter 120 may be formed in shape of a circular plate. The substrate supporter 120 may support the plurality of substrates (W), for example, semiconductor substrate or wafer. Preferably, the plurality of substrates (W) may be arranged at fixed intervals in a circular pattern on the substrate supporter 120 so as to improve the yield.

The gas distributor 130 comprises first to fourth gas distribution modules 130a, 130b, 130c and 130d which are spatially separated from one another with respect to the central portion of the substrate supporter 120, and are respectively inserted into the first to fourth module receivers 115a, 115b, 115c and 115d. The first to fourth gas distribution modules 130a, 130b, 130c and 130d respectively distribute first gas (G1) and second gas (G2) to gas distribution regions of the substrate supporter 120. Accordingly, the first gas (G1) and the second gas (G2) distributed from the respective first to fourth gas distribution modules 130a, 130b, 130c and 130d react on the substrate (W) loaded onto the substrate supporter 120, to thereby form a thin film layer on the substrate (W).

The first gas (G1) is activated by plasma discharge, and the activated first gas is distributed to the substrate (W). The first gas (G1) may be reactant gas (RG) which forms the thin film layer by the reaction with source gas (SG) to be explained later. For example, the reactant gas (RG) may be at least any one kind of gas selected from nitrogen (N2), oxygen (O2), nitrogen dioxide (NO2), and ozone (O3).

The second gas (G2) may be the source gas (SG) including a thin film material to be deposited on the substrate (W). The source gas may include the thin film material of silicon (Si), titanium family element (Ti, Zr, Hf, and etc.), or aluminum (Al). For example, the source gas including the thin film material of silicon (Si) may be the gas selected from TEOS (Tetraethylorthosilicate), DCS (Dichlorosilane), HCD (Hexachlorosilane), TriDMAS (Tri-dimethylaminosilane), TSA (Trisilylamine), SiH2Cl2, SiH4, Si2H6, Si3H8, Si4H10, and Si5H12.

Each of the first to fourth gas distribution modules 130a, 130b, 130c and 130d may include a ground electrode frame 210, a gas hole pattern member 230, an insulating member 240, and a power source electrode 250.

The ground electrode frame 210 may be provided with a first gas distribution space (S1) for distributing the first gas (G1), and a second gas distribution space (S2) for distributing the second gas (G2). The ground electrode frame 210 is inserted into each of the mould receiver 115a, 115b, 115c and 115d of the chamber lid 115, and is electrically grounded through the chamber lid 115. To this end, the ground electrode frame 210 may include an upper plate 210a, a ground sidewall 210b, and a ground barrier member 210c.

The upper plate 210a is formed in a rectangular shape, and is connected with the corresponding module receiver 115a, 115b, 115c and 115d. In the upper plate 210, there are an insulating member support hole 212, a first gas supply hole 214, and a second gas supply hole 216.

The insulating member support hole 212 penetrates through the upper plate 210a so that the insulating member support hole 212 is communicated with the first gas distribution space (S1). The insulating member support hole 212 is formed to have a rectangular-shaped plane.

The first gas supply hole 214 penetrates through the upper plate 210a so that the first gas supply hole 214 is communicated with the first gas distribution space (S1). According as the first gas supply hole 214 is connected with an externally-provided first gas supply means (not shown) through a gas supply pipe (not shown), the first gas supply hole 214 is supplied with the first gas (G1), that is, reactant gas (RG) from the first gas supply means (mot shown) through the gas supply pipe (not shown). The plurality of first gas supply holes 214 may be formed at both sides of the insulating member support hole 212, wherein the plurality of first gas supply holes 214 may be provided at fixed intervals, and be communicated with the first gas distribution space (S1). The first gas (G1) supplied to the first gas supply hole 214 is supplied to the first gas distribution space (S1), activated by the plasma discharge inside the first gas distribution space (S1), and then downwardly distributed at a first pressure toward the substrate (W). To this end, the lower surface of the first gas distribution space (S1) functions as a first gas distribution portion 213 having an entirely open shape so that the first gas (G1) is downwardly distributed without additional gas distribution hole pattern.

The second gas supply hole 216 penetrates through the upper plate 210a so that the second gas supply hole 216 is communicated with the second gas distribution space (S2). According as the second gas supply hole 216 is connected with an externally-provided second gas supply means (not shown) through a gas supply pipe (not shown), the second gas supply hole 216 is supplied with the second gas (G2), that is, source gas (SG) from the second gas supply means (mot shown) through the gas supply pipe (not shown). The plurality of second gas supply holes 216 may be provided at fixed intervals in the upper plate 210a, and may be communicated with the second gas distribution space (S2).

Each of the plurality of ground sidewalls 210b having a predetermined height vertically protrudes from the lower surface of each of long and short sides of the upper plate 210a, to thereby prepare a rectangular-shaped opening at a lower side of the upper plate 210a. Each ground sidewall 210b is electrically grounded through the chamber lid 115, whereby each ground sidewall 210b functions as a ground electrode.

The ground barrier member 210c having a predetermined height vertically protrudes from the lower surface of the center portion of the upper plate 210a, wherein the ground bather member 210c is arranged in parallel to the long sides of the ground sidewalls 210b. The first gas distribution space (S1) and the second gas distribution space (S2) are separated from each other by the use of ground bather member 210c. The ground bather member 210c may be formed as one body with the ground electrode frame 210, or may be electrically connected with the ground electrode frame 210 and electrically grounded through the ground electrode frame 210, whereby the ground bather member 210c may function as a ground electrode.

In the above description, the ground electrode frame 210 includes the upper plate 210a, the ground sidewalls 210b, and the ground barrier member 210c, but not limited to this structure. For example, the upper plate 210a, the ground sidewalls 210b, and the ground barrier member 210c included in the ground electrode frame 210 may be formed as one body.

Meanwhile, it is possible to change the position of the first and second gas distribution spaces (S1, S2) in the ground electrode frame 210. That is, the position of the first and second gas distribution spaces (S1, S2) may be positioned to expose the substrate (W), which is rotated by rotation of the substrate supporter 120, to the second gas (G2) firstly and then to the first gas (G1) secondly, or may be positioned to expose the substrate (W), which is rotated by rotation of the substrate supporter 120, to the first gas (G1) firstly and then to the second gas (G2) secondly.

The gas hole pattern member 230 is provided in the second gas distribution space (S2), wherein the gas hole pattern member 230 prevents the first gas (G1), which is distributed from the first gas distribution space (S1) positioned next to the second gas distribution space (S2) while the ground barrier member 210c is provided between the first and second gas distribution spaces (S1, S2), from being diffused, back-flowing or permeating into the second gas distribution space (S2). That is, if the first gas (G1) is diffused, back-flows or permeates into the second gas distribution space (S2), the first gas (G1) may react with the second gas (G2) inside the second gas distribution space (S2), whereby a thin film may be deposited onto the inner sidewall of the second gas distribution space (S2), or a thin film of powder material may be formed onto the inner sidewall of the second gas distribution space (S2) and thus particles may fall down onto the substrate (W). Thus, the gas hole pattern member 230 prevents the thin film from being deposited onto the inner sidewall of the second gas distribution space (S2), or prevents the thin film of power material from being formed onto the inner sidewall of the second gas distribution space (S2).

The gas hole pattern member 230 may be formed as one body with the lower surfaces of the respective ground sidewalls 210b and the ground barrier member 210c for preparing the second gas distribution space (S2) so as to cover the lower surface of the second gas distribution space (S2), or may be formed in an insulating plate (or shower head) of non-polarity insulating material and connected with the lower surface of the second gas distribution space (S2). Accordingly, a predetermined gas diffusion space or gas buffering space is prepared in the second gas distribution space (S2) between the upper plate 210a of the ground electrode frame 210 and the gas hole pattern member 230.

The gas hole pattern member 230 may include a plurality of second gas distribution portions 232 to downwardly distribute the second gas (G2), which is supplied to the second gas distribution space (S2) through the second gas supply hole 216, toward the substrate (W).

The plurality of second distribution portions 232 are formed in the hole pattern shape to be communicated with the second gas distribution space (S2) in which the second gas (G2) is diffused. Thus, the second gas (G2) is downwardly distributed toward the substrate (W) at a second pressure, wherein the second pressure of the second gas (G2) is higher than a distribution pressure of the first gas (G1). The gas hole pattern member 230 raises the distribution pressure of the second gas (G2) distributed to the substrate (W), to thereby prevent the first gas (G1) distributed to the first gas distribution space (S1) from being diffused, back-flowing and permeating into the second gas distribution space (S2).

Also, the gas hole pattern member 230 downwardly distributes the second gas (G2) through the second gas distribution portion 232, and the gas hole pattern member 230 is formed in the plate shape having the holes so as to delay or slow down the flow of the second gas (G2), thereby reducing gas consumption of the second gas (G2). In addition, a flux of gas may be adjusted by changing the hole pattern shape of the gas distribution portion 232, to thereby improve efficiency in using the second gas (G2).

The insulating member 240 is formed of an insulating material. The insulating member 240 is inserted into the insulating member support hole 212, and is connected to the upper surface of the ground electrode frame 210 by the use of engaging member (not shown). The insulating member 240 may include an electrode insertion hole being communicated with the first gas distribution space (S1).

The power source electrode 250 is formed of a conductive material. The power source electrode 250 penetrating through the electrode insertion hole protrudes out of the lower surface of the ground electrode frame 210, whereby the power source electrode 250 having a predetermined height is provided in the first gas distribution space (S1). In this case, the protruding height of the power source electrode 250 is the same as those of the ground sidewalls 210b of the ground electrode frame 210 and the ground bather member 210c functioning as the ground electrode.

The power source electrode 250 is electrically connected with a plasma power supplier 140 by the use of feed cable, thereby generating the plasma discharge in the first gas distribution space (S1) in accordance with plasma power supplied from the plasma power supplier 140. That is, the plasma discharge occurs between each of the ground sidewalls 210b and the ground barrier member 210c functioning as the ground electrode and the power source electrode 250 supplied with the plasma power, to thereby activate the first gas (G1) supplied to the first gas distribution space (S1).

The plasma power supplier 140 generates the plasma power having a predetermined frequency, and supplies the plasma power to the first to fourth gas distribution modules 130a, 130b, 130c and 130d through the feed cable, in common or individually. In this case, the plasma power is supplied with high frequency (HF) power or very high frequency (VHF) power. For example, the HF power has a frequency range of 3 MHz~30 MHz, and the VHF power has a frequency range of 30 MHz~300 MHz.

Meanwhile, the feed cable is connected with an impedance matching circuit (not shown). The impedance matching circuit matches load impedance and source impedance of the plasma power supplied from the plasma power supplier 140 to the first to fourth gas distribution modules 130a, 130b, 130c and 130d. The impedance matching circuit may include at least two of impedance element (not shown) formed of at least one of variable capacitor and variable inductor.

The aforementioned first to fourth gas distribution modules 130a, 130b, 130c and 130d respectively generate the plasma discharge in the first gas distribution space (S1) in accordance with the plasma power supplied to the power source electrode 250, activates the first gas (G1) of the first gas distribution space (S1) by the plasma discharge, and downwardly distributes the activated first gas (G1). At the same time, the respective first to fourth gas distribution modules 130a, 130b, 130c and 130d downwardly distribute the second gas (G2) of the second gas distribution space (S2) at the predetermined pressure through the gas hole pattern member 230.

As described above, unlike the related art, the plasma discharge space of the present invention is not formed between the power source electrode and the substrate, but is formed between the power source electrode and the ground electrode confronting each other. According to the present invention, since the plasma discharge space is not overlapped with a thin film formation region on the substrate (W) supported by the substrate supporter 120, it is possible to prevent the substrate (W) from being damaged by the plasma charge, and to prevent quality of the thin film deposited on the substrate (W) from being deteriorated.

Especially, as shown in FIG. 4, according to one embodiment of the present invention, a height (H) between the power source electrode 240 and the substrate (W) is larger than a distance (D) between the power source electrode 240 and the ground electrode 210b, to thereby overcome problems caused by the plasma discharge. If the height (H) between the power source electrode 240 and the substrate (W) is smaller than the distance (D) between the power source electrode 240 and the ground electrode 210b, the plasma discharge may occur between the power source electrode 240 and the substrate supporter 120 for supporting the substrate (W), whereby the substrate (W) may be damaged by the plasma discharge.

According to one embodiment of the present invention, the power source electrode 250 and the ground electrode 210b vertically protrude with respect to the surface of the substrate (W). Thus, cations or electrons generated by the plasma discharge are not transferred to the surface of the substrate (W), but transferred to the direction of the power source electrode 250 or the ground electrode 210b in parallel to the surface of the substrate (W), thereby minimizing effects of the plasma discharge on the substrate (W).

Hereinafter, a substrate processing method using the substrate processing apparatus 100 according to one embodiment of the present invention will be described in detail as follows.

First, the plurality of gas distribution modules 130a, 130b, 130c and 130d are installed inside the process chamber 110, and at least one substrate (W) is loaded onto the substrate supporter 120.

While the substrate supporter 120 having the substrate (W) loaded thereonto is rotated to the predetermined direction (for example, counterclockwise direction), the first gas (G1) and the second gas (G2) are downwardly distributed to the substrate (W) through at least one gas distribution module among the plurality of gas distribution modules, thereby generating the plasma discharge. Accordingly, the predetermined thin film material is deposited on each substrate (W), which passes below each of the gas distribution modules 130a, 130b, 130c and 130d in accordance with the rotation of the substrate supporter 120, by the mutual reaction of the first gas (G1) and the second gas (G2) distributed from the respective gas distribution modules.

According to one embodiment of the present invention, the thin film is deposited on each substrate (W) by distributing the first gas (G1) and the second gas (G2) through the plurality of gas distribution modules 130a, 130b, 130c and 130d arranged to divide the reaction space into the plurality of division spaces, thereby enhancing deposition uniformity of the thin film, improving deposition speed and deposition efficiency, and facilitating to control quality of the thin film.

In case of the related art, since the source gas is distributed to the entire regions of the substrate (W), it lowers efficiency in using the source gas. Meanwhile, the present invention uses the plurality of gas distribution modules 130a, 130b, 130c and 130d, thereby improving efficiency in using the source gas.

Figure 5:
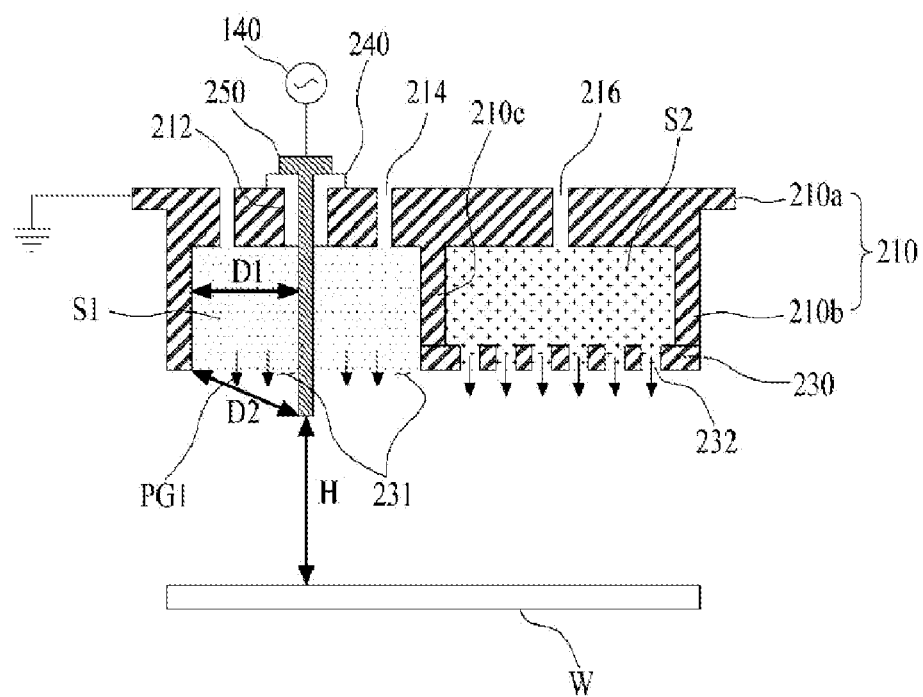
FIG. 5 is a cross sectional view illustrating a gas distribution module arranged on a substrate according to another embodiment of the present invention.
Figure 6:
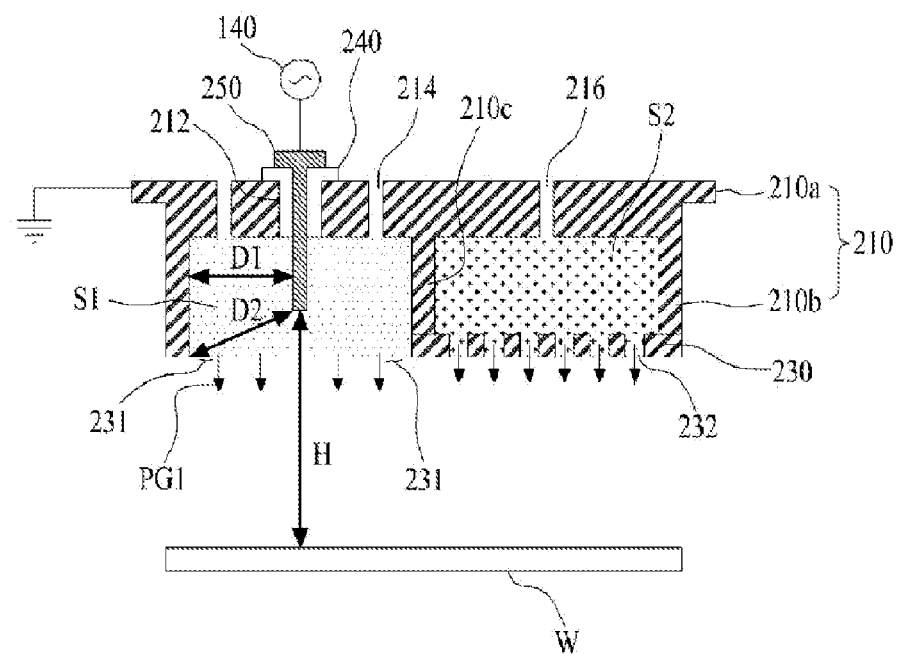
FIG. 6 is a cross sectional view illustrating a gas distribution module arranged on a substrate according to another embodiment of the present invention.

FIG. 5 is a cross sectional view illustrating a gas distribution module arranged on a substrate according to another embodiment of the present invention. FIG. 6 is a cross sectional view illustrating a gas distribution module arranged on a substrate according to another embodiment of the present invention. Except the protruding height of the power source electrode 250, FIGS. 5 and 6 are identical in structure to FIG. 4, whereby the same reference numbers will be used throughout the drawings to refer to the same or like parts, and a detailed explanation for the same parts will be omitted.

As shown in FIG. 5, the power source electrode 250 protrudes in such a manner that the protruding height of the power source electrode 250 is more than the ground sidewall 210b of the ground electrode frame 210 functioning as the ground electrode. As shown in FIG. 6, the power source electrode 250 protrudes in such a manner that the protruding height of the power source electrode 250 is less than the ground sidewall 210b of the ground electrode frame 210 functioning as the ground electrode.

In the structures of FIGS. 5 and 6, a distance (D2) between an end of the power source electrode 240 and an end of the ground electrode 210b is larger than a distance (D1) between predetermined portions of the power source electrode 240 and the ground electrode 210b positioned at the same height. In order to overcome problems caused by the plasma discharge, a height (H) between the power source electrode 240 and the substrate (W) is larger than the distance (D2) between the end of the power source electrode 240 and the end of the ground electrode 210b, preferably.

Figure 7:
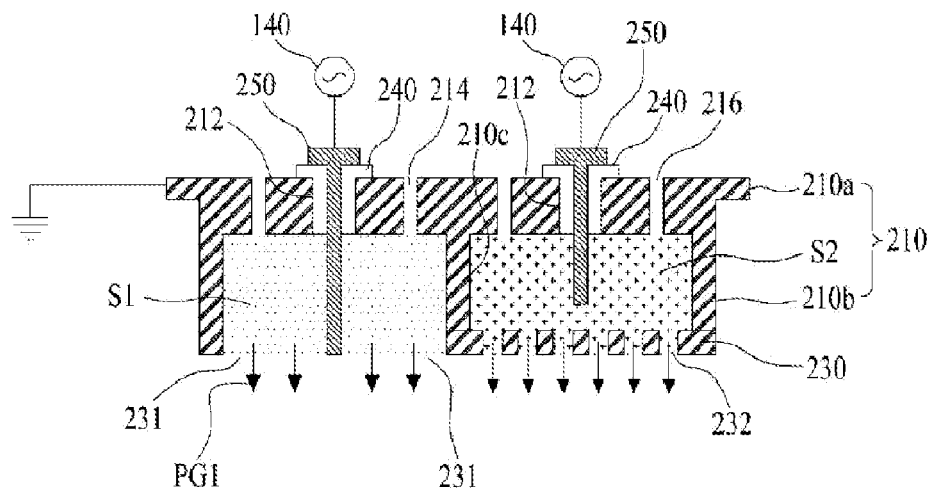
FIG. 7 is a cross sectional view illustrating a gas distribution module according to another embodiment of the present invention.

FIG. 7 is a cross sectional view illustrating a gas distribution module arranged on a substrate according to another embodiment of the present invention. In FIG. 7, a power source electrode 450 is additionally provided in the second gas distribution space (S2) of the gas distribution module shown in FIG. 4. Hereinafter, only different structures will be shown as follows.

According to another embodiment of the present invention, as shown in FIG. 7, the power source electrode 450 is additionally provided in the second gas distribution space (S2). To this end, an insulating member support hole 215 penetrating through an upper plate 210a is communicated with the second gas distribution space (S2), and an insulating member 240 is inserted into the insulating member support hole 215. In this case, the insulating member 240 includes an electrode insertion hole being communicated with the second gas distribution space (S2), whereby the power source electrode 450 penetrates and protrudes through the electrode insertion hole.

The power source electrode 450 provided in the second gas distribution space (S2) is identical in structure to the power source electrode provided in the first gas distribution space (S1).

Figure 8:
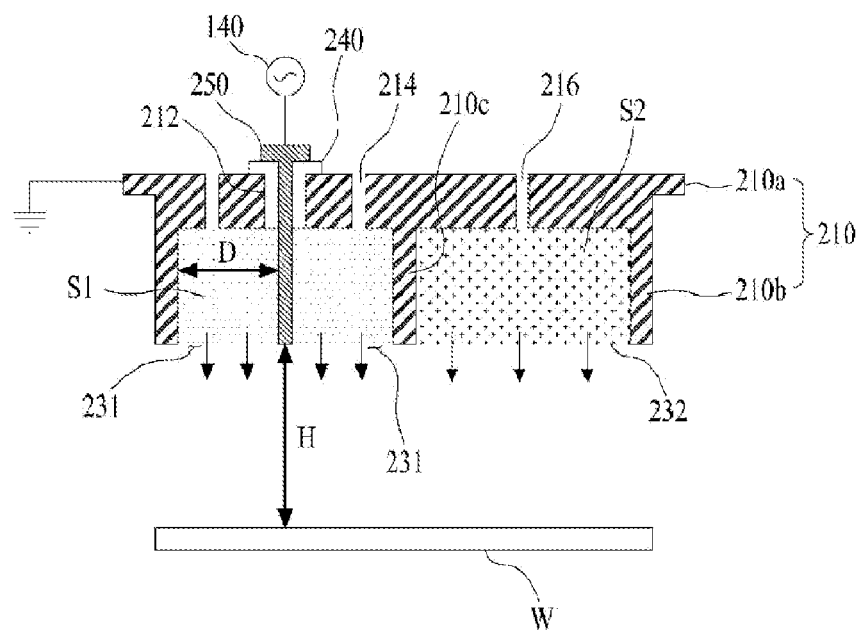
FIG. 8 is a cross sectional view illustrating a gas distribution module according to another embodiment of the present invention.

FIG. 8 is a cross sectional view illustrating a gas distribution module according to another embodiment of the present invention, which is obtained by omitting a gas hole pattern member 230 from the second gas distribution space (S2) of the gas distribution module shown in FIG. 4. That is, the gas hole pattern member 230 enables to obtain the aforementioned advantages, however, it is not necessary to provide the gas hole pattern member 230.

Figure 9:
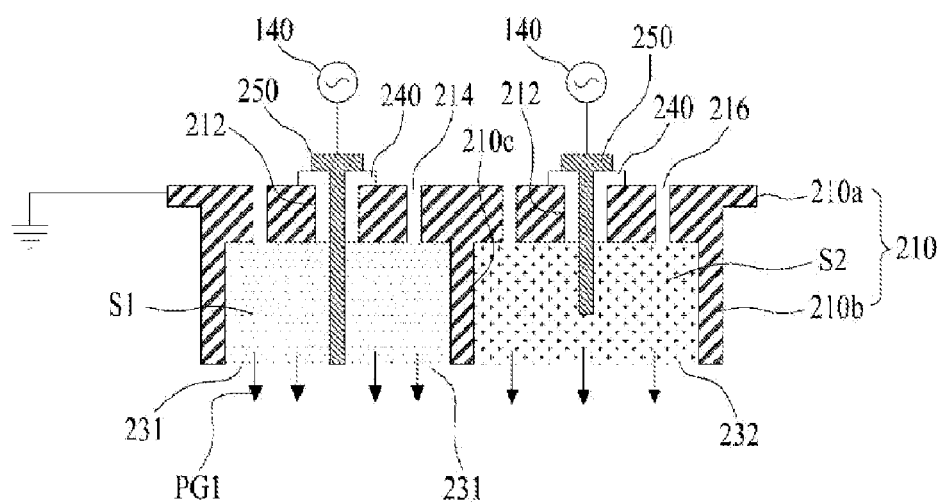
FIG. 9 is a cross sectional view illustrating a gas distribution module according to another embodiment of the present invention.

FIG. 9 is a cross sectional view illustrating a gas distribution module according to another embodiment of the present invention, which is obtained by omitting a gas hole pattern member 230 from the second gas distribution space (S2) of the gas distribution module shown in FIG. 7.

Figure 10:
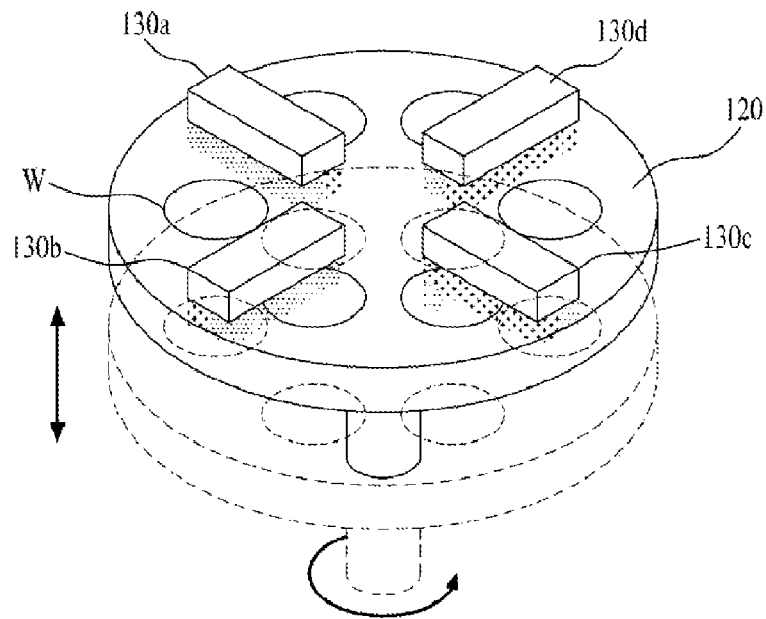
FIG. 10 illustrates a substrate processing apparatus according to another embodiment of the present invention.
Figure 11:
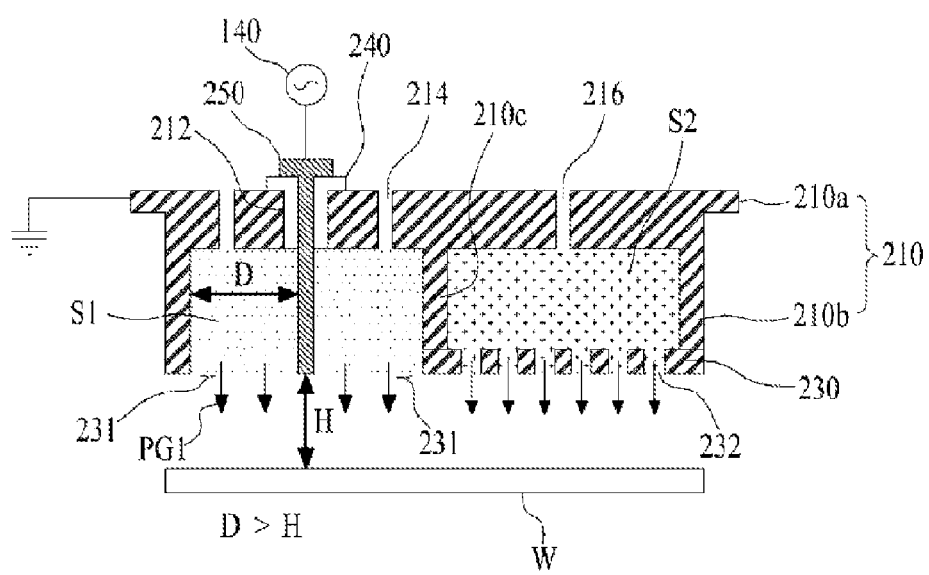
FIGS. 11 and 12 are flow charts illustrating a substrate processing method using the substrate processing apparatus of FIG. 10.
Figure 12:
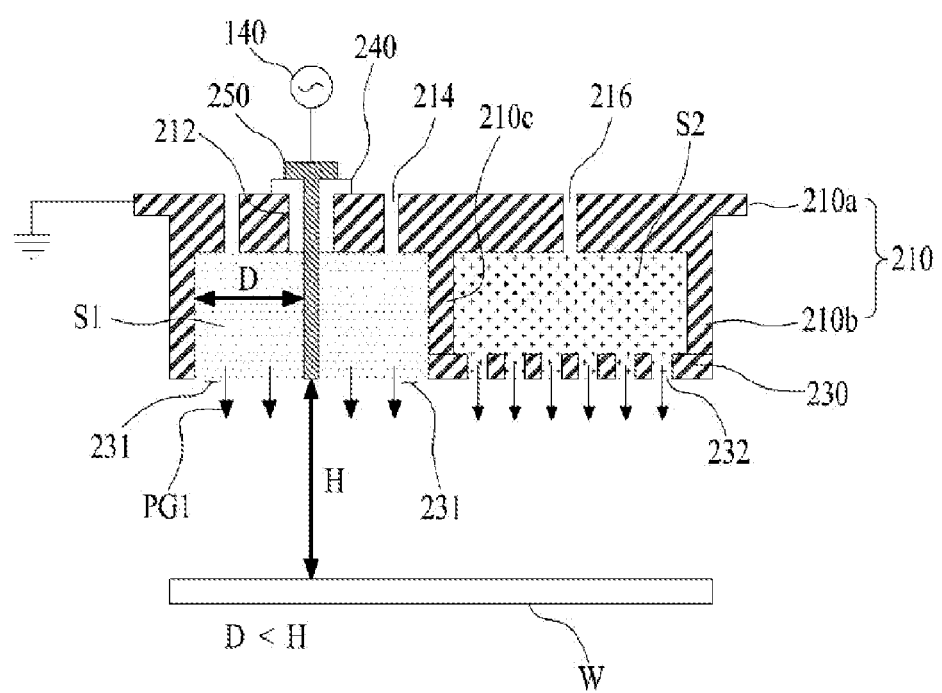

FIG. 10 is a cross sectional view illustrating a substrate processing apparatus according to another embodiment of the present invention. FIGS. 11 and 12 illustrate a substrate processing method using the substrate processing apparatus of FIG. 10.

According to the substrate processing apparatus of FIG. 10, a substrate supporter 120 is connected with a predetermined elevating apparatus (not shown), whereby the substrate supporter 120 is moved up and down by the elevating apparatus (not shown). This elevating apparatus for moving the substrate supporter 120 may be any one among various apparatuses generally known to those in the art.

Hereinafter, only different structures, which are different from those of the aforementioned embodiments of the present invention, will be described as follows.

According to the substrate processing apparatus of FIG. 10, the substrate supporter 120 is moved up and down. Accordingly, as shown in FIGS. 11 and 12, it facilitates to adjust a height (H) between a power source electrode 250 and a substrate (W).

Thus, as shown in FIG. 11, as the substrate supporter 120 is moved upward by the use of elevating apparatus, the height (H) between the power source electrode 250 and the substrate (W) is smaller than a distance (D) between the power source electrode 250 and a ground electrode 210b. In this case, a plasma discharge may occur between the power source electrode 250 and the substrate supporter 120, whereby a plasma discharge space may be overlapped with a thin film formation region of the substrate (W) supported by the substrate supporter 120. If the plasma discharge space is overlapped with the thin film formation region, the surface of the substrate (W) is largely affected by the plasma discharge.

Meanwhile, a precleaning process before deposition process is performed to remove foreign matters from the substrate (W). If the precleaning process before deposition process is performed under the condition that the plasma discharge space is overlapped with the thin film formation region of the substrate (W), cleaning efficiency may be improved. Thus, according to another embodiment of the present invention, the precleaning process before deposition process or a process for modulating a surface roughness of the substrate (W) may be performed under the condition that the plasma discharge space is overlapped with the thin film formation region of the substrate (W).

According as the substrate supporter 120 is moved upward by the use of elevating apparatus, the height (H) between the power source electrode 250 and the substrate (W) is decreased so that the thin film deposition speed is increased. In addition to the precleaning process before deposition process or the process of modulating the surface roughness of the substrate (W), the thin film formation process, which is less affected by the plasma, may be performed under the condition that the plasma discharge space is overlapped with the thin film formation region of the substrate (W).

In FIG. 12, the substrate supporter 120 is moved down by the use of elevating apparatus, the height (H) between the power source electrode 250 and the substrate (W) becomes larger than the distance (D) between the power source electrode 250 and the ground electrode 210b. In this case, the plasma discharge space is not overlapped with the thin film formation region of the substrate (W) supported by the substrate supporter 120, whereby the thin film deposition process is performed without any bad effects on the substrate (W) by the plasma discharge.

Figure 13:
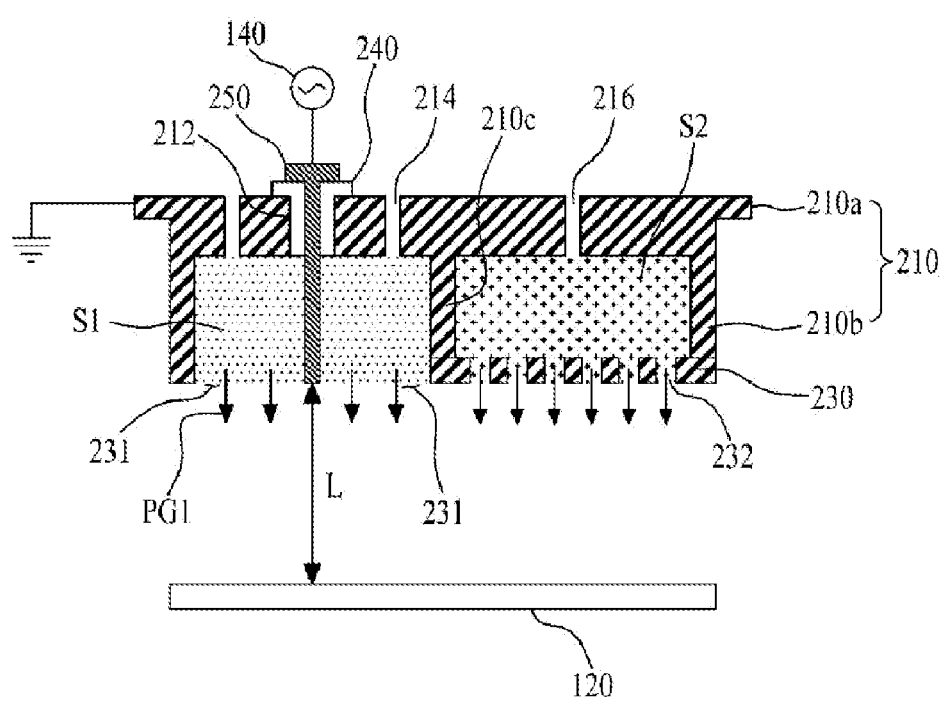
FIG. 13 is a cross sectional view illustrating a gas distribution module according to another embodiment of the present invention.

FIG. 13 is a cross sectional view illustrating a gas distribution module according to another embodiment of the present invention.

Referring to FIGS. 2, 10 and 13, according to another embodiment of the present invention, reactant gas and source gas are individually distributed to first gas distribution space (S1) and second gas distribution space (S2), which are spatially separated from each other, so that it is possible to realize the individual control for the reactant gas and the source gas.

Especially, flows of the reactant gas and the source gas can be controlled by adjusting a rotation speed of a substrate supporter 120 or adjusting an interval between each of gas distribution modules 130a, 130b, 130c and 130d and the substrate supporter 120, to thereby control quality of the thin film layer and deposition speed of the thin film layer. This will be described in detail as follows.

First, while maintaining the fixed interval between each of the gas distribution modules 130a, 130b, 130c and 130d and the substrate supporter 120, the rotation speed of the substrate supporter 120 is adjusted to control the flows of the reactant gas and the source gas, to thereby control the quality of the thin film layer and the deposition speed of the thin film layer. This method will be described with reference to the following Table 1.

TABLE 1

| Rotation speed | Deposition speed | Gas flow | Quality of thin film |
| --- | --- | --- | --- |
| First rotation speed (fast) | Fast | Reactant gas and source gas are reacted with each other, and then deposited | Low |
| Second rotation speed (slow) | Slow | Reactant gas and source gas are sequentially layered and deposited | High |
| Third rotation speed (medium) | Medium | Some of reactant gas and source gas are deposited by reaction, and the remaining gases are sequentially layered and deposited | Medium |

As shown in the above Table 1, if the substrate supporter 120 is rotated at the relatively-fast first rotation speed, the first gas (reactant gas) and the second gas (source gas) are reacted with each other, and thus the thin film layer is deposited on the substrate (W). That is, if the substrate supporter 120 is rotated at the relatively-fast first rotation speed, the deposition speed becomes fast, however, the quality of thin film layer is deteriorated similarly to a general CVD process.

If the substrate supporter 120 is rotated at the relatively-slow second rotation speed, the first gas (reactant gas) and the second gas (source gas) are sequentially layered on the substrate (W), to thereby deposit the thin film layer. That is, if the substrate supporter 120 is rotated at the relatively-slow second rotation speed, the deposition speed becomes slow, however, the quality of thin film layer is improved similarly to a general ALD process.

If the substrate supporter 120 is rotated at the third rotation speed which is slower than the first rotation speed and is faster than the second rotation speed, some of the first gas (reactant gas) and the second gas (source gas) react and thus the thin film layer is deposited on the substrate (W), and the remaining gases are sequentially layered on the substrate (W), to thereby deposit the thin film layer. That is, if the substrate supporter 120 is rotated at the third rotation speed corresponding to the medium speed, the deposition speed is medium, and the quality of thin film layer is similar to the quality of thin film obtained by combination of the general CVD process and ALD process.

According to another embodiment of the present invention, the quality of the thin film layer and the deposition speed of the thin film layer can be easily controlled by adjusting the rotation speed of the substrate supporter 120. Thus, the rotation speed of the substrate supporter 120 may be determined in consideration of the characteristics of the thin film to be deposited.

While the rotation speed of the substrate supporter 120 is maintained at the predetermined speed, the interval between each of the gas distribution modules 130a, 130b, 130c and 130d and the substrate supporter 120 is adjusted to control the quality of the thin film layer and the deposition speed of the thin film layer. This method will be described with reference to the following Table 2.

TABLE 2

| Interval | Deposition speed | Gas flow | Quality of thin film |
| --- | --- | --- | --- |
| First interval (large) | Slow | Reactant gas and source gas are reacted with each other, and then deposited | Low |
| Second interval (small) | Fast | Reactant gas and source gas are sequentially layered and deposited | High |
| Third interval (medium) | Medium | Some of reactant gas and source gas are deposited by reaction, and the remaining gases are sequentially layered and deposited | Medium |

As shown in the above Table 2, if the interval between each of the gas distribution modules 130a, 130b, 130c and 130d and the substrate supporter 120 is set to the relatively-large first interval (See 'L' of FIG. 13), the first gas (reactant gas) and the second gas (source gas) are reacted with each other, and thus the thin film layer is deposited on the substrate (W). That is, if setting the relatively-large first interval, the deposition speed becomes slow, and the quality of thin film layer is deteriorated similarly to the general CVD process.

If the interval between each of the gas distribution modules 130a, 130b, 130c and 130d and the substrate supporter 120 is set to the relatively-small second interval (See 'L' of FIG. 13), the first gas (reactant gas) and the second gas (source gas) are sequentially layered on the substrate (W), to thereby deposit the thin film layer. That is, if setting the relatively-small second interval, the deposition speed becomes fast, and the quality of thin film layer is improved similarly to the general ALD process.

If the interval between each of the gas distribution modules 130a, 130b, 130c and 130d and the substrate supporter 120 is set to the third interval which is smaller than the first interval and is larger than the second interval, some of the first gas (reactant gas) and the second gas (source gas) react and thus the thin film layer is deposited on the substrate (W), and the remaining gases are sequentially layered on the substrate (W), to thereby deposit the thin film layer. That is, if setting the third interval corresponding to the medium interval, the deposition speed is medium, and the quality of thin film layer is similar to the quality of thin film obtained by combination of the general CVD process and ALD process.

According to another embodiment of the present invention, the quality of the thin film layer and the deposition speed of the thin film layer deposited can be easily controlled by adjusting the interval (See 'L' of FIG. 13) between each of the gas distribution modules 130a, 130b, 130c and 130d and the substrate supporter 120. Thus, the interval (See 'L' of FIG. 13) between each of the gas distribution modules 130a, 130b, 130c and 130d and the substrate supporter 120 may be determined in consideration of the characteristics of the thin film to be deposited.

According to another embodiment of the present invention, the quality of the thin film layer and the deposition speed of the thin film layer deposited can be easily controlled by adjusting the rotation speed of the substrate supporter 120 and the interval (See 'L' of FIG. 13) between each of the gas distribution modules 130a, 130b, 130c and 130d and the substrate supporter 120.

According to another embodiment of the present invention, unlike the related art, the plasma discharge space of the present invention is not formed between the power source electrode 250 and the substrate (W), but is formed between the power source electrode 250 and the ground electrode 210b confronting each other, so that it is possible to prevent the substrate (W) from being damaged by the plasma discharge. Also, according to one embodiment of the present invention, the power source electrode 250 and the ground electrode 210b vertically protrudes with respect to the surface of the substrate (W), whereby cations or electrons generated by the plasma discharge are not transferred to the surface of the substrate (W), but transferred to the direction of the power source electrode 250 or the ground electrode 210b in parallel to the surface of the substrate (W), thereby minimizing effects of the plasma discharge on the substrate (W).

Hereinafter, a substrate processing method using the substrate processing apparatus 100 according to another embodiment of the present invention will be described in detail as follows.

First, the plurality of gas distribution modules 130a, 130b, 130c and 130d are installed inside the process chamber 110, and at least one substrate (W) is loaded onto the substrate supporter 120.

After determining the interval between each of the gas distribution modules 130a, 130b, 130c and 130d and the substrate supporter 120, the interval is adjusted by elevating the substrate supporter 120. The process of determining the interval between each of the gas distribution modules 130a, 130b, 130c and 130d and the substrate supporter 120 may be performed before loading the substrate (W).

The process of determining the interval (L) between each of the gas distribution modules 130a, 130b, 130c and 130d and the substrate supporter 120 is performed in accordance with the characteristics of the thin film layer to be formed, as mentioned above. In more detail, if the thin film layer is deposited on the substrate (W) by the mutual reaction of the first gas (reactant gas) and the second gas (source gas), wherein the quality of the thin film layer is similar to that of the CVD process, the interval (L) is determined as the relatively-large first interval. If the first gas (reactant gas) and the second gas (source gas) are sequentially layered on the substrate (W), and thus the thin film layer is deposited on the substrate (W), wherein the quality of the thin film layer is similar to that of the ALD process, the interval (L) is determined as the relatively-small second interval. If the thin film layer is deposited on the substrate (W) by reaction of some of the first gas (reactant gas) and the second gas (source gas), and the remaining gases are sequentially layered on the substrate (W) and thus the thin film layer is deposited on the substrate (W), wherein the quality of thin film layer is similar to the quality of thin film obtained by combination of the general CVD process and ALD process, the interval (L) is determined as the third interval which is smaller than the first interval and is larger than the second interval.

Then, the rotation speed of the substrate supporter 120 is determined, and the substrate supporter 120 is rotated at the determined rotation speed.

In this case, the process of determining the rotation speed of the substrate supporter 120 is performed in accordance with the characteristics of the thin film layer to be formed, as mentioned above. In more detail, if the thin film layer is deposited on the substrate (W) by the mutual reaction of the first gas (reactant gas) and the second gas (source gas), wherein the quality of the thin film layer is similar to that of the CVD process, the rotation speed is determined as the relatively-fast first rotation speed. If the first gas (reactant gas) and the second gas (source gas) are sequentially layered on the substrate (W), and thus the thin film layer is deposited on the substrate (W), wherein the quality of the thin film layer is similar to that of the ALD process, the rotation speed is determined as the relatively-slow second rotation speed. If the thin film layer is deposited on the substrate (W) by reaction of some of the first gas (reactant gas) and the second gas (source gas), and the remaining gases are sequentially layered on the substrate (W) and thus the thin film layer is deposited on the substrate (W), wherein the quality of thin film layer is similar to the quality of thin film obtained by combination of the general CVD process and ALD process, the rotation speed is determined as the third rotation speed which is slower than the first rotation speed and is faster than the second rotation speed.

Then, the thin film formation process is performed by downwardly distributing the first gas (G1) and the second gas (G2) to the substrate (W) through the use of at least one of the plurality of gas distribution modules, to thereby form the thin film layer in accordance with the aforementioned embodiments.

The thin film formation process may comprise a first thin film formation process and a second thin film formation process. In this case, the first thin film formation process and the second thin film formation processes are respectively performed under the different processing conditions, so that it is possible to obtain first and second thin film layers whose qualities are different from each other.

In detail, the rotation speed of the substrate supporter 120 during the first thin film formation process may be different from the rotation speed of the substrate supporter 120 during the second thin film formation process, or the interval between each of the gas distribution modules 130a, 130b, 130c and 130d and the substrate supporter 120 during the first thin film formation process may be different from the interval between each of the gas distribution modules 130a, 130b, 130c and 130d and the substrate supporter 120 during the second thin film formation process.

The first thin film layer and the second thin film layer may be formed of the same material, or different materials.

As mentioned above, according to another embodiment of the present invention, the thin film is deposited on the substrate (W) by distributing the first gas (G1) and the second gas (G2) through the plurality of gas distribution modules 130a, 130b, 130c and 130d arranged to spatially divide the reaction space, thereby enhancing deposition uniformity of the thin film, improving deposition speed and deposition efficiency, and facilitating to control quality of the thin film.

In case of the related art, since the source gas is distributed to the entire regions of the substrate, it lowers efficiency in using the source gas. Meanwhile, the present invention uses the plurality of gas distribution modules 130a, 130b, 130c and 130d, thereby improving efficiency in using the source gas.

According to the present invention, the plasma discharge space is not formed between the power source electrode 250 and the substrate (W), but is formed between the power source electrode 250 and the ground electrode 210b confronting each other. Thus, the plasma discharge space is not overlapped with the thin film formation region of the substrate (W) supported by the substrate supporter 120, so that it is possible to prevent the substrate (W) from being damaged by the plasma discharge, and to prevent the quality of the thin film from being deteriorated.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing apparatus comprising:
    a process chamber;
    a substrate supporter for supporting at least one substrate, wherein the substrate supporter is provided in the process chamber, and the substrate supporter is rotated at a predetermined direction;
    a chamber lid for covering an upper side of the process chamber; and
    a gas distributor having a plurality of gas distribution modules for distributing gas to the substrate, wherein the plurality of gas distribution modules are connected to the chamber lid,
    wherein each of the gas distribution modules includes a power source electrode and a ground electrode confronting each other, a plasma discharge space is formed between the power source electrode and the ground electrode, and
    wherein the substrate supporter is connected with a predetermined elevating apparatus, the plasma discharge space is not overlapped with a thin film formation region of the substrate supported by the substrate supporter when the substrate supporter is moved down by the use of elevating apparatus, and the plasma discharge space is overlapped with the thin film formation region of the substrate supported by the substrate supporter when the substrate supporter is moved up by the use of elevating apparatus.

2. The apparatus of claim 1,
    wherein a height between the power source electrode and the substrate is larger than a distance between the power source electrode and the ground electrode when the substrate supporter is moved down, and
    the height between the power source electrode and the substrate is smaller than the distance between the power source electrode and the ground electrode when the substrate supporter is moved up.

3. The apparatus of claim 2, wherein the distance between the power source electrode and the ground electrode corresponds to a distance between an end of the power source electrode and an end of the ground electrode.

4. The apparatus of claim 1, wherein the power source electrode and the ground electrode vertically protrude with respect to the substrate surface so as to transfer cations or electrons, generated by a plasma discharge, to a direction in parallel to the substrate surface.

5. The apparatus of claim 1, wherein the second gas distribution space is additionally provided with a gas hole pattern member which prevents the first gas distributed from the first gas distribution space from flowing to the second gas distribution space.

6. The apparatus of claim 1, wherein the second gas distribution space is provided with an additional power source electrode and a ground electrode.

* * * * *